(12) United States Patent
Coppola et al.

(10) Patent No.: US 7,295,078 B2
(45) Date of Patent: Nov. 13, 2007

(54) HIGH-SPEED, ACCURATE TRIMMING FOR ELECTRONICALLY TRIMMED VCO

(75) Inventors: Francesco Coppola, Antibes (FR); Gianni Puccio, La Gaude (FR); Jean-Christophe Jiguet, Antibes (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/667,870

(22) Filed: Sep. 22, 2003

(65) Prior Publication Data
US 2005/0062551 A1  Mar. 24, 2005

(51) Int. Cl.
*H03L 7/10* (2006.01)

(52) U.S. Cl. .................................. 331/44; 331/179
(58) Field of Classification Search ................. 331/44, 331/179, 177 V, 117 R, 36 C, 17, 1 A; 327/156–159
See application file for complete search history.

(56) References Cited

U.S. PATENT DOCUMENTS

| | | |
|---|---|---|
| 5,686,864 A | 11/1997 | Martin et al. |
| 5,942,949 A * | 8/1999 | Wilson et al. ................. 331/17 |
| 6,268,778 B1 * | 7/2001 | Mucke et al. ............ 331/117 R |
| 6,323,736 B2 * | 11/2001 | Jansson ........................ 331/44 |
| 6,404,289 B1 | 6/2002 | Su et al. |
| 6,686,804 B1 * | 2/2004 | Adams et al. ................. 331/17 |
| 2002/0075080 A1 | 6/2002 | Nelson et al. |

FOREIGN PATENT DOCUMENTS

EP  0 910 170 A2  4/1999

* cited by examiner

*Primary Examiner*—Joseph Chang
(74) *Attorney, Agent, or Firm*—Ronald O. Neerings; W. James Brady, III; Frederick J. Telecky, Jr.

(57) ABSTRACT

A tuning circuit uses a VCO with a trimming capacitor bank. The trimming capacitor bank is calibrated by logic to accommodate a desired frequency, $f_{wanted}$. A search renders an initial control word that is accurate within one LSB. In a first embodiment, comparisons between the desired frequency and the upper and lower frequency bounds of the VCO with the trimming capacitor bank configured by the initial control word. The control word may be increased or decreased based on the comparisons. In a second embodiment, differences between the desired frequency and the actual frequency of the VCO, with the trimming capacitor bank configured by the initial control word, are compared to a threshold. The control word may be increased or decreased based on the comparison.

12 Claims, 5 Drawing Sheets

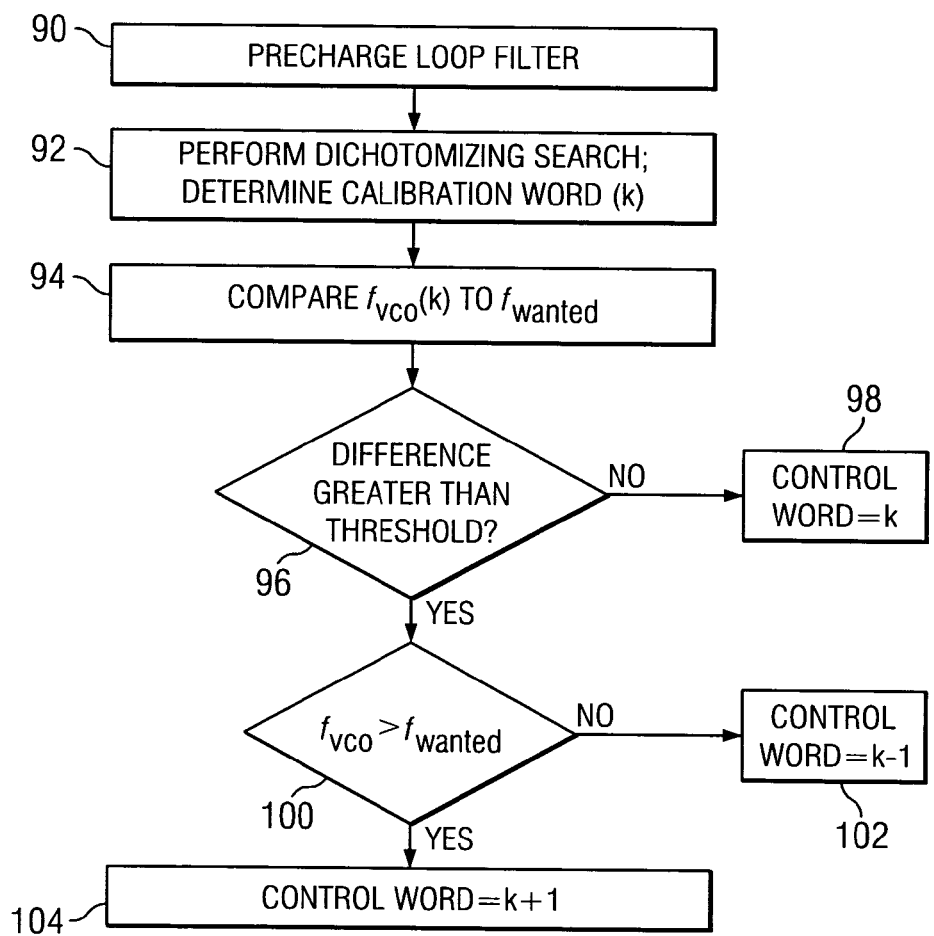

HIGH-SPEED, ACCURATE TRIMMING FOR ELECTRONICALLY TRIMMED VCO

CROSS-REFERENCE TO RELATED APPLICATIONS

This application is related to U.S. Ser. No. 09/815,831, entitled "Electronically Trimmed VCO" to Bisanti et al, filed Mar. 23, 2001, which is incorporated by reference herein.

STATEMENT OF FEDERALLY SPONSORED RESEARCH OR DEVELOPMENT

Not Applicable

BACKGROUND OF THE INVENTION

1. Technical Field

This invention relates in general to electronic circuits and, more particularly, to a digitally controlled VCO (voltage controlled oscillator).

2. Description of the Related Art

Voltage controlled oscillators (VCOs) are used in a variety of electronic circuits. One particularly important application using VCOs is in mobile communications, where VCOs are used into the phase-locked loop system to generate the frequency with the desired precision and stability characteristic. VCOs are also used in a variety of other applications.

Typically, the VCO is formed on the circuit board using an LC tank including and inductor and a varactor. In order to ensure that the tuning range of the VCO is wide enough to cover the required bandwidth, and to compensate for the spread of other components, the tank formed on the circuit board is initially fabricated to cover a frequency range in excess of the optimum frequency range. During the manufacturing process, the tank is adjusted to cover an optimum frequency range by trimming the inductance of the tank.

Trimming the tank is a relatively expensive procedure, particularly for mass produced circuits, such as cellular transceivers. Further, trimming procedures require that the tank be formed on the circuit board rather than integrating the VCO on a chipset. This further increases the cost of the circuit using the VCO.

In U.S. Ser. No. 09/815,831, entitled "Electronically Trimmed VCO" to Bisanti et al, filed Mar. 23, 2001, which is incorporated by reference herein, a voltage controlled oscillator is described which uses a bank of switched capacitors coupled to the tank and varactor. This solution provides a number of advantages. First, the need to physically trim the inductor of the LC tank is eliminated. Second, the bank of switched capacitors can be set such that the VCO's free running frequency is close to the desired frequency in order to reduce the tuning range required to the varactor. This provides for fast tuning of a phase lock loop incorporating the voltage controlled oscillator. Third, the capacitor bank can be incorporated on an integrated circuit, reducing the cost of implementing the voltage controlled oscillator. Fourth, the capacitors in the bank can have very small values, providing very precise tuning.

The increase of integration in communication circuits brings the need of designing fully integrated VCOs that are able to cover wide frequency bands despite the high process spread of the on-chip components. Use of the digital trimming allows for a broad effective tuning range of the VCO, while the tuning range attributable to the varactor can remain small. Therefore, a high sensitivity is not required to achieve a broad tuning range. With a lower VCO sensitivity, better noise performances can be achieved and it is easier to integrate the varactor of the tank on an integrated circuit.

However, it is important to perform the digital trimming (calibration) accurately, otherwise, it is possible that the chosen calibration setting will not include the desired frequency within the frequency range of the VCO, which would render the circuit inoperable. Further, if settling time is important, it is desirable to calibrate the VCO such that a minimal change in control voltage is needed to obtain the desired frequency.

Therefore, a need has arisen for a fast, accurate trimming technique.

BRIEF SUMMARY OF THE INVENTION

In the present invention, a tuning circuit comprises a voltage controlled oscillator for generating a first clock signal, where the voltage controlled oscillator includes an inductive element, a variable capacitive element coupled to the inductive element and a bank of switched capacitors coupled to the inductive element and the variable capacitive element. A frequency divider generates a second clock signal responsive to the first clock signal and a predetermined divisor. Frequency control circuitry controls the variable capacitive element responsive to a frequency difference between the first and second clock signals. Logic circuitry determines an initial control word to configure the trimming capacitor bank using a search responsive to a desired frequency and determines whether the initial control word should either remain the same or change to an adjacent control word.

The present invention provides significant advantages over the prior art. First, a determination of an initial control word can be made using fast comparisons in the search, followed by more precise comparisons to determine a final control word. In a first embodiment, after the search, the upper and lower bounds of the resulting VCO frequency range are compared to the desired frequency to determine whether the control word should be increased or decreased. In a second embodiment, a threshold is compared to a frequency difference between the desired frequency and the actual VCO frequency to determine whether the control word should be increased or decreased.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which:

FIG. 11 is a flow chart describing calibration of the circuit of FIG. 10.

DETAILED DESCRIPTION OF THE INVENTION

The present invention is best understood in relation to FIGS. 1–11 of the drawings, like numerals being used for like elements of the various drawings.

Figure 1:
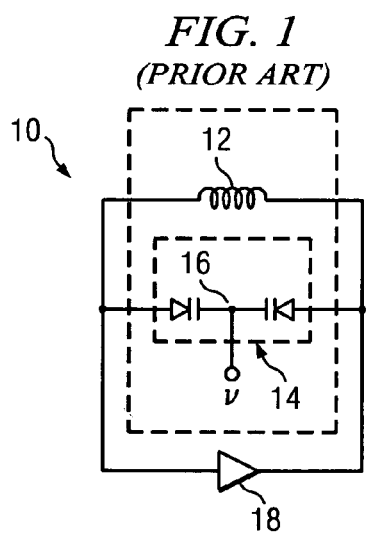
FIG. 1 illustrates a schematic of a prior art LC tank.

FIG. 1 illustrates a schematic of a prior art LC tank 10. LC tank 10 includes an inductor 12 coupled to varactor 14. A variable voltage ($\upsilon$) at node 16 controls varactor 14. The active stage 18 is provides the energy necessary to sustain the oscillation.

Figure 2:
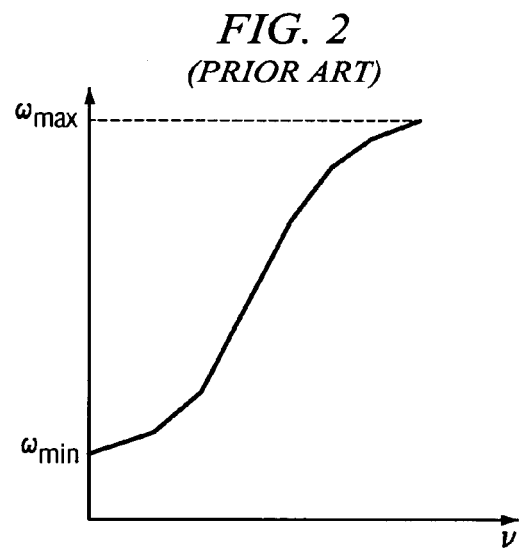
FIG. 2 shows the output frequency ω of the circuit of FIG. 1 as a function of $\upsilon$.

In operation, the LC tank 10 produces a frequency $\omega=(LC(\upsilon))^{-1/2}$, where L is the inductance of inductor 12, and $C(\upsilon)$ is the capacitance of varactor 14 as a function of control voltage v. FIG. 2 shows the output frequency $\omega$ of the circuit as a function of $\upsilon$.

The LC tank 10 can produce frequencies in the range between $\omega_{min}=(LC_{max})^{-1/2}$ and $\omega_{max}=(LC_{min})^{-1/2}$, where $C_{min}$ and $C_{max}$ are the capacitive limits of the varactor. To cover a wide frequency range, the inductor 12 may be oversized, and then trimmed to optimize performance with the other components on the system. However, this can be a very costly procedure, especially for mass produced parts. Further, the inductor 12 must be fabricated on the circuit board, rather than on an integrated circuit, in order to allow for trimming.

Figure 3:
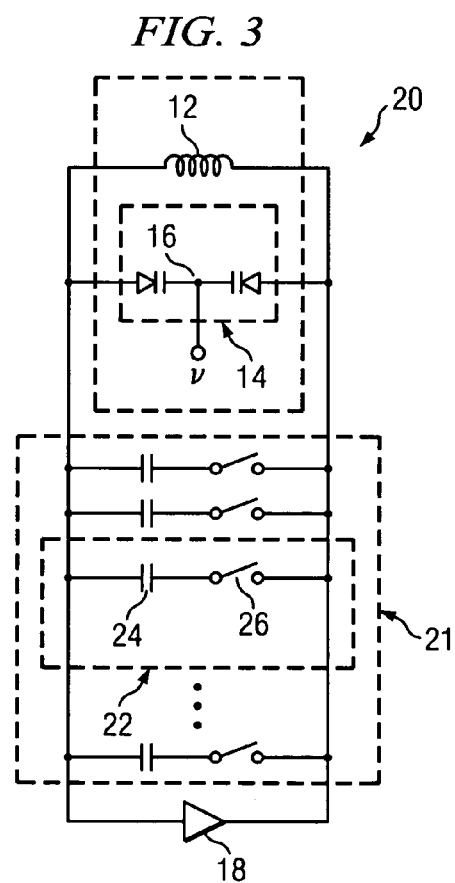
FIG. 3 illustrates a schematic of an LC tank with a trimming capacitor bank.

FIG. 3 illustrates a schematic of an LC tank 20 with an additional capacitor bank used in the present invention. As in FIG. 1, the LC tank 20 includes an inductor 12 coupled with varactor 14. The variable voltage ($\upsilon$) at node 16 controls varactor 14. The active stage 18 is used to provide the energy necessary to sustain the oscillation. In addition, a bank 21 of switched capacitors 22 is coupled in parallel with varactor 14. Each switched capacitor can be considered as a capacitance whose value can be either $C_{on}$ or $C_{off}$ according to the value of a digital control signal $b_i$.

Accordingly, the capacitance of tank 20 equals $C(\upsilon)+mC_{on}+(M-m)C_{off}$, where m is the number of capacitors enabled by the digital control signal and $0<=m<=M$, where M is the total number of capacitors in the bank 21. It is assumed herein that each capacitor has the same, or close to the same value of $C_{on}$ and $C_{off}$. However, it would also be possible to design bank 21 with capacitors of different values of $C_{on}$ and $C_{off}$. For example, a bank of capacitors could have values of $1 \times C_{on/off}$, $2 \times C_{on/off}$, $4 \times C_{on/off}$, $8 \times C_{on/off}$, and so on.

Figure 4:
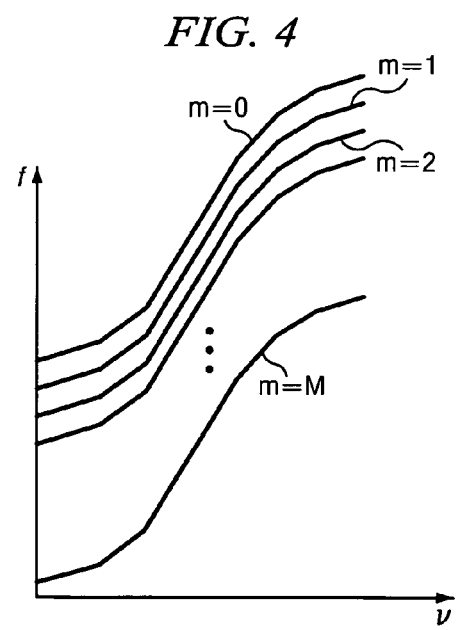
FIG. 4 illustrates the frequency as a function of $\upsilon$ for different states of the trimming capacitor bank.

The frequency (in radians/sec) of tank 20 is thus equal to $\omega=(L(C(\upsilon)+mC_{on}+(M-m)C_{off}))^{-1/2}$. For a given value of m, the frequency will vary between $\omega_{min}=(L(C_{max}+C_B))^{-1/2}$ and $\omega_{max}=(L(C_{min}+C_B))^{-1/2}$, where $C_B=mC_{on}+(M-m)C_{off}$ and $C_{max}$ is the upper capacitive range of the varactor 14 and $C_{min}$ is the lower capacitive range of the varactor 14. The frequency as a function of $\upsilon$ is different for each value of m, as shown in FIG. 4. Accordingly, the frequency range of tank 20 can be varied as desired by adjusting the number of enabled switched capacitors 22 in bank 21.

Figure 5:
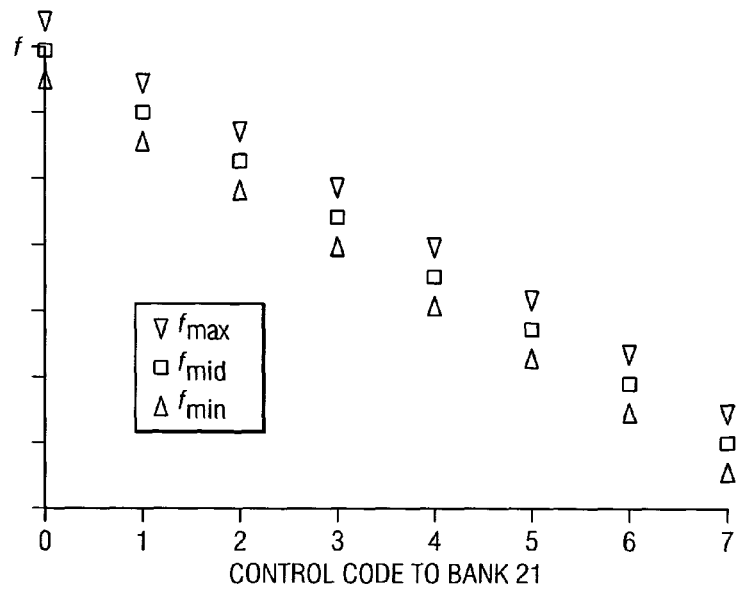
FIG. 5 illustrates a frequency diagram of a first scenario with a relatively small overlap in frequency range between adjacent codes to the trimming capacitor bank.

FIG. 5 illustrates a frequency diagram of a first scenario, where there is a relatively small overlap in frequency range between adjacent codes to the bank 21. In the illustrated embodiment, bank 21 includes seven capacitors 24, hence the control word can have a value between zero (all capacitors disabled) and seven (all capacitors enabled). In the illustrated embodiment of FIG. 5, there is about a 50% overlap between adjacent control words; i.e., the midpoint of the frequency range ($f_{mid}$, assuming that the analog control voltage to the varactor 14 is set to the middle of its capacitive range during calibration) for a particular control word is at about the same level as the lower bound of the frequency range ($f_{max}$) for the preceding control word and at about the same level as the upper bound of the frequency range ($f_{max}$) for the subsequent control word.

Figure 6:
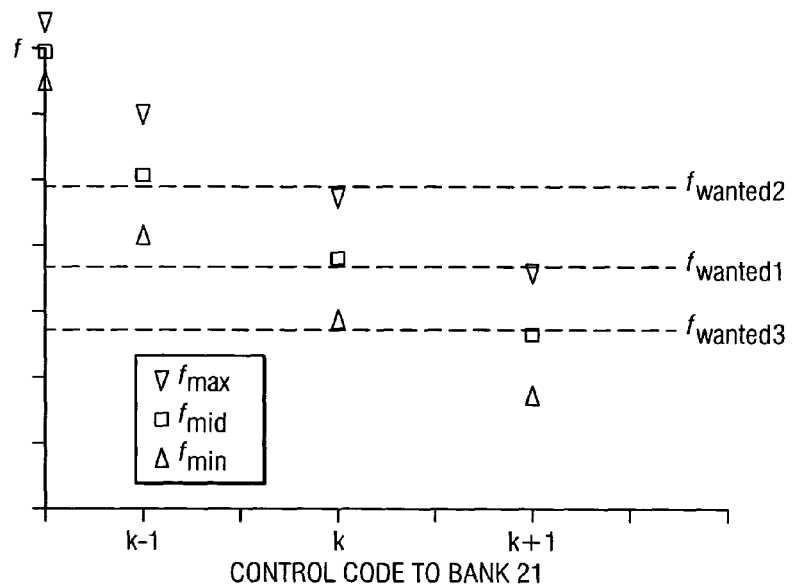
FIG. 6 illustrates a problem is deriving an proper control word for configuring the trimming capacitor bank using the scenario of FIG. 5.

FIG. 6 illustrates the problem in greater detail. During calibration, a tuning circuit will lock onto a frequency that is a multiple of a reference frequency, $f_{ref}$. The multiplier will change during operation of the tuning circuit, for example, to tune to a different channel. Using the LC tank 20 of FIG. 3, the trimming capacitors 24 in bank 21 will need to be configured for each multiplier change to ensure that the desired frequency $f_{wanted}$ is within the frequency range of the varactor 14. Logic in the tuning circuit will choose a control word using a dichotomizing (or other) search which successively halves a set of control words until an appropriate control word is obtained. Generally, this is performed with the varactor voltage $\upsilon$ set to a middle value, so that the varactor will have a capacitance in the middle of its range.

Referring to FIG. 5, a dichotomizing search could work as follows for a frequency $f_{wanted}$ that is in the center of the frequency range of control word "5" (i.e., five capacitors 24 enabled in tank 21). Initially, control word "4" would be chosen (enabling four capacitors). With $\upsilon$ at a middle value ($\upsilon_{cal}$) for varactor 14, the output of the VCO (voltage controlled oscillator) incorporating LC tank 20 will be higher than the desired frequency $f_{wanted}$. This eliminates control words "0" through "4". Next, control word "6" would be chosen. In this case, the output of the VCO will be lower than $f_{wanted}$. Control word "5" would then be chosen as the appropriate control word.

While a dichotomizing search is used in the illustrated embodiment, it should be noted that other searches, such as simple ramp (successively increasing the control code by one until the desired frequency is not crossed) or a Newton search (which corrects a frequency error by assuming a VCO characteristic with a constant slope). A ramp method is easily implemented, but slow in execution. The Newton method converges quickly, but is relatively difficult to implement.

A search for the proper control word may lead to one of three results: (1) it may choose the optimum control word, (2) it may choose a control word that is one higher than the optimum control word or (3) it may choose a control word that is one lower than the optimum control word. This is illustrated in FIG. 6, where three different desired frequencies are shown: $f_{wanted1}$, $f_{wanted2}$, and $f_{wanted3}$. In each case, the control word selected by the dichotomizing search is control word k.

In the case of $f_{wanted1}$, k is the optimum control word, since it is in the approximate middle of the frequency range associated with that control word. However, for the case of $f_{wanted2}$, the desired frequency is in the middle of the frequency range associated with control word k−1 and, as illustrated in FIG. 6, it is above upper boundary of the frequency range associated with control word k. Therefore, the desired frequency cannot be reached at the control word determined by the dichotomizing search.

Similarly, for the case of $f_{wanted3}$, the desired frequency is close to the middle of the frequency range associated with control word k+1 and is below the lower boundary of the frequency range associated with control word k. Therefore, the desired frequency cannot be reached at the control word determined by the dichotomizing search.

Figure 7:
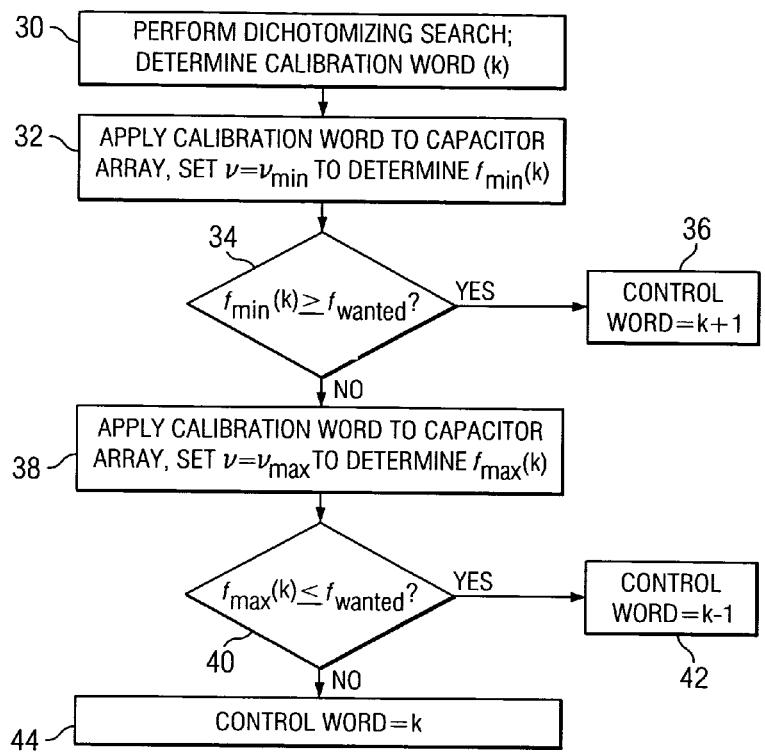
FIG. 7 is a flowchart describing a method to ensure that the desired frequency is within the frequency range associated with the selected control word.

FIG. 7 is a flowchart describing a method to ensure that the desired frequency is within the frequency range associated with the selected control word. In step 30, the dichotomizing search is performed (with the varactor voltage set to $\upsilon_{cal}$) to determine a control word k at an accuracy of ±1 LSB (least significant bit). In step 32, the varactor voltage $\upsilon$ is set to its minimum $\upsilon_{min}$; therefore, the frequency of the output of the VCO will be at its lowest boundary for control word k ($f_{min}(k)$). In decision block 34, if $f_{min}(k)$ is greater than or equal to $f_{wanted}$, then the next control word (k+1) is chosen as the control word in block 36.

If, in decision block 34, $f_{min}(k)$ is less than $f_{wanted}$, then the varactor voltage $\upsilon$ is set to its maximum, $\upsilon_{max}$ in block 38; therefore the frequency of the output of the VCO will be at its highest boundary for control word k ($f_{max}(k)$). In decision block 40, if $f_{max}(k)$ is less than or equal to $f_{wanted}$, then the preceding control word (k−1) is chosen as the control word in block 42.

If $f_{min}(k)$ is less than $f_{wanted}$ in decision block 34 and if $f_{max}(k)$ is greater than $f_{wanted}$ in decision block 40, then k remains as the control word in block 44.

Figure 8:
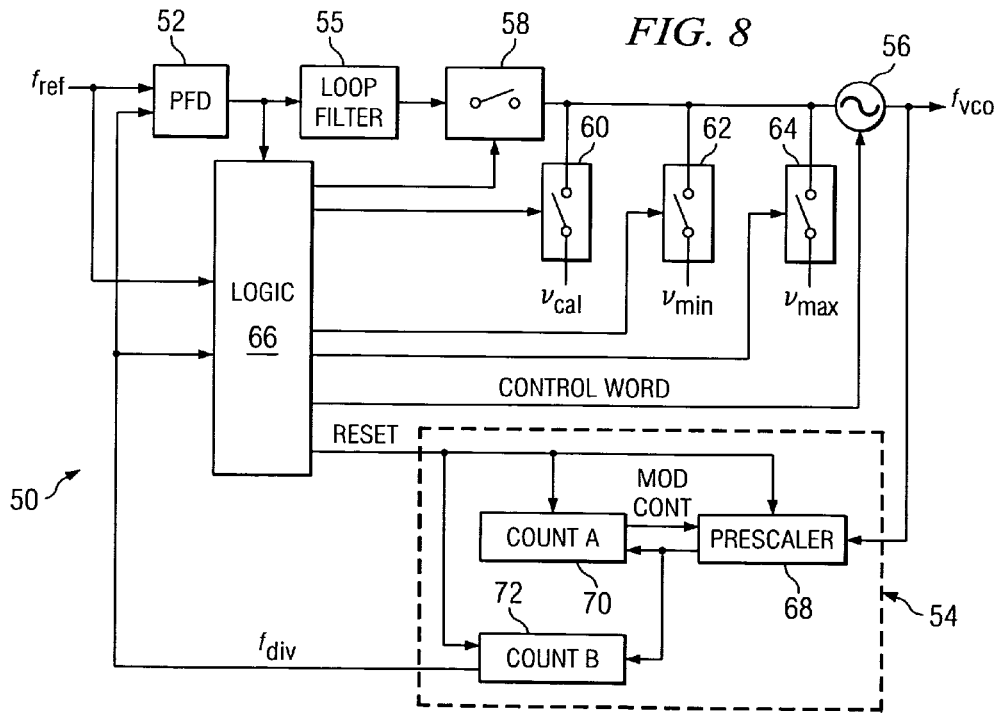
FIG. 8 illustrates a block diagram of a tuning circuit 50 using the method described in FIG. 7.

FIG. 8 illustrates a block diagram of a tuning circuit 50 using the method described in FIG. 7. Reference signal $f_{ref}$ is input to PFD (phase frequency detector) 52, along with the output of a frequency divider 54 ($f_{div}$). The output of the PFD 52 is input to loop filter 55. The output of loop filter 55 is selectively coupled to a VCO 56 through switch 58. Three voltages, $\upsilon_{cal}$, $\upsilon_{min}$ and $\upsilon_{max}$ are also selectively coupled to VCO 56 through respective switches 60, 62 and 64. Switches 58, 60, 62 and 64 are controlled by logic 66. VCO 56 includes a LC tank 20 (not shown) of the type shown in FIG. 3. Logic 66 supplies the control word to the bank 21 of the LC tank 20 in the VCO 56. The output of VCO is $f_{vco}$, which is input to the frequency divider 54. Logic 66 also receives $f_{ref}$ and $f_{div}$ and the output of PFD 52.

In the illustrated embodiment, the frequency divider 54 uses a dual modulus prescaler 68 along with two counters, Counter A 70 and Counter B 72. The operation of this type of frequency divider is discussed in greater detail in connection with FIG. 10.

In normal operation, switch 58 is enabled, coupling the output of loop filter 55 to the VCO 56. The VCO output, $f_{vco}$, is divided by frequency divider 54 to generate $f_{div}$, which is compared to $f_{ref}$. PFD 52 is a digital circuit which receives the reference clock $f_{ref}$ and overflow pulses from counter B 72 of the frequency divider 54. If an overflow pulse is received before the end of a reference clock period (indicating that $f_{vco}$ is too high), the voltage is reduced to reduce the frequency of the clock generated by the VCO 56. Similarly, if an overflow pulse is not received by the end of a reference clock period (indicating that $f_{vco}$ is to low), the voltage is increased to increase the frequency of the clock generated by the VCO 56. Consequently, for a divide-by-N frequency divider 54, $f_{vco}=f_{ref}*N$. When a new channel is requested, the value of N changes. In this instance, it is necessary to calibrate the LC tank 20 of the VCO 56 in order to ensure that the bank 21 is set to produce the desired frequency.

Logic 66 performs the method shown in FIG. 7. At the beginning of calibration, $\upsilon_{cal}$, which sets varactor 14 to the middle of its capacitive range, is coupled to the VCO 56 through switch 60 (under control of logic 66). The remaining switches 58, 62 and 64 are disabled. The dichotomizing search is performed by logic 66 to get an initial control word. Switch 62 is enabled (and the other switches disabled) to pass $\upsilon_{min}$ to the VCO 56. The PFD 52 compares the divided output of the VCO, $f_{div}$, to the reference, $f_{ref}$, to determine whether $f_{min}(k) \geq f_{wanted}$, since $f_{div}=f_{min}(k)/N$ and $f_{ref}=f_{wanted}/N$. If so, the control word is increased by one (k+1). If not, switch 64 is enabled (and the other switches disabled) to pass $\upsilon_{max}$ to VCO 56. The $f_{div}$ is compared with $f_{ref}$, to determine whether $f_{max}(k) \leq f_{wanted}$. If so, the control word is decreased by one (k+1).

Once the capacitance of bank 21 is set, switch 58 is enabled, and the other switches disabled. Variations in the capacitance of VCO 56 are controlled by the output of PFD 52, which compares $f_{div}$ with $f_{ref}$ and generates a voltage corresponding to the differences in frequencies. PFD 52, loop filter 55 and frequency divider 54 form a phase lock loop (PLL) with VCO 56. Differentials between $f_{div}$ with $f_{ref}$ cause PFD 52 to vary $\upsilon$ such that the capacitance from varactor 14 adjusts the frequency of VCO 56 to the desired value.

This embodiment of the invention allows relaxed overlap between adjacent bands. Accordingly, for a given frequency range, the number of trimming capacitors 26 can be reduced relative to an approach where there is less overlap between adjacent control words (see, for example, FIG. 9). Alternatively, with a larger number of trimming capacitors, the VCO sensitivity (the analog frequency range) can be reduced, reducing the size of varactor 14.

While the final precision of the calibration is less than ±0.5 LSB, it is not required that all frequency comparisons be performed with such precision. During the dichotomizing search, the comparison precision can be reduced to ±1 LSB; only the last two steps need a more precise comparison. A more precise comparison can be obtained, for example, by adding dividers to the inputs of the PFD 52 to lengthen the input clocks. The dividers are enabled only for the last two precise comparisons and are bypassed for the fast comparisons. Because higher precision comparisons require more time, the dichotomizing search can be performed with high speed comparisons, with two longer comparisons at the end to determine the final control word. With a six bit control word, for example, there can be six fast comparisons in the dichotomizing search and only two precise comparisons to determine whether and increase or decrease in the control word is necessary.

Figure 9:
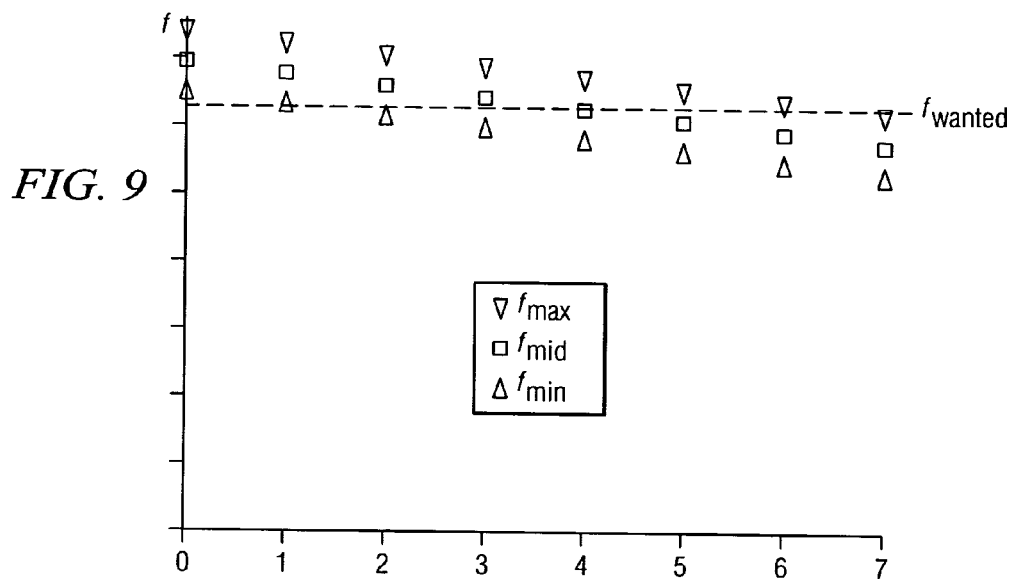
FIG. 9 illustrates where the overlap between adjacent control words is significantly increased from the scenario of FIGS. 5 and 6.

FIG. 9 illustrates where the overlap between adjacent control words is significantly increased from the scenario of FIGS. 5 and 6. A broader overlap could be used, for example, if a higher VCO sensitivity is desired, as well as a very high trimming precision.

If, for example, the loop filter is pre-charged at the value used as the control voltage ($\upsilon_{cal}$) during the calibration and if the calibration is performed with a very high accuracy (i.e., $f_{mid}$ is very close to $f_{wanted}$), then the PLL settling time after the calibration will be very short because the analog control voltage will not need to vary significantly before locking on the desired frequency. As shown in FIG. 9, at the optimal control word k=4, there will be little settling time. At any other control word, the settling time to reach $f_{wanted}$ will increase over the optimal setting.

Figure 10:
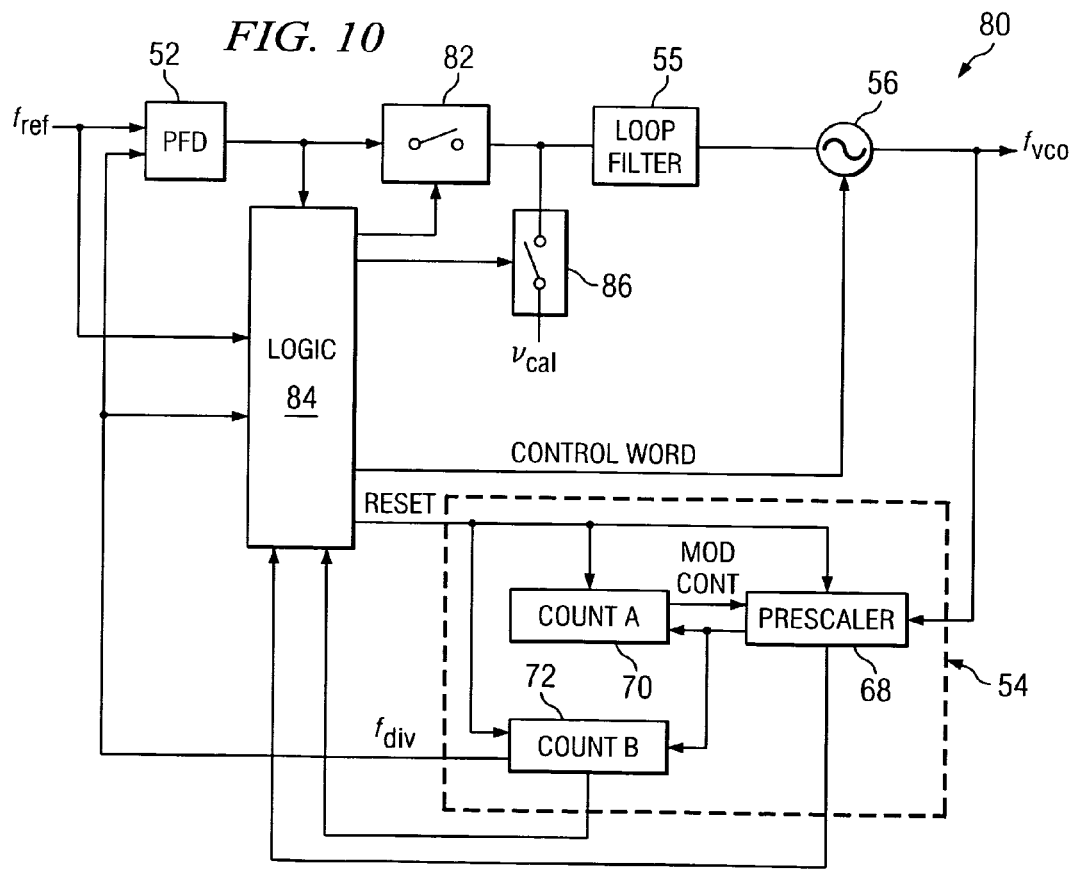
FIG. 10 illustrates a block diagram of a tuning circuit to address the scenario of FIG. 9.

FIG. 10 illustrates a block diagram of a tuning circuit 80 to address the scenario of FIG. 9. For illustration, similar blocks from FIG. 8 share the same reference numerals. Reference signal $f_{ref}$ is input to PFD 52, along with the output of a frequency divider 54 ($f_{div}$). The output of the PFD 52 is input to loop filter 55 through switch 82, controlled by logic 84. Voltage source $\upsilon_{cal}$ is also coupled to loop filter 55 through switch 86, which is controlled by logic 84. The output of loop filter 55 is coupled to VCO 56. VCO 56 includes a LC tank 20 (not shown) of the type shown in FIG. 3. Logic 84 supplies the control word to the bank 21 of the LC tank 20 in the VCO 56. The output of VCO is $f_{vco}$, which is input to the frequency divider 54. Logic 84 also receives $f_{ref}$ and $f_{div}$ and the output of PFD 52. Frequency divider 54 uses a dual modulus prescaler 68 along with two counters, Counter A 70 and Counter B 72. The state (current count) in counter B 72 and prescaler 68 is coupled to logic 84. Logic 84 also can reset counter A 70, counter B 72 and prescaler 68. The output of PFD 52 is also coupled to logic 84.

A dual modulus divider operates as follows. The prescaler counts either P or P+1 clocks of $f_{vco}$, responsive to a control signal from counter A 70. Counter A 70 counts up to A overflows of the prescaler 68. Counter B 72 counts up to B overflows of the prescaler 68 (B>A). When counter A 70 overflows, it changes the modulus of the prescaler 68 from P+1 to P. Counter B 72 thus counts A iterations of a P+1 prescaler and (B−A) iterations of a P prescaler. Accordingly, the total number of $f_{vco}$ clocks counted prior to a counter B overflow is: (B−A)*P+A(P+1)=BP−AP+AP+A=BP+A.

The operation of the tuning circuit 80 is described in connection with FIG. 11. In step 90, the loop filter 55 is precharged to $\upsilon_{cal}$ by enabling switch 86 and disabling switch 82. In step 92, the dichotomizing search is performed to determine an initial calibration word (k) at an accuracy of ±1 LSB. In step 94, logic 84 compares the frequency of the VCO 56 at control word k to the desired frequency, $f_{wanted}$. A preferred embodiment for comparing the frequencies is described below.

In decision block 96, if the difference between $f_{vco}$ and $f_{wanted}$ is within a predetermined threshold, then k is used as the final control word in block 98. If not, then if $f_{vco}$ is less than $f_{wanted}$ in decision block 100, then k−1 is used as the control word in block 102. If $f_{vco}$ is greater than $f_{wanted}$ in decision block 100, then k+1 is used as the control word in block 104. After the final control word is chosen, switch 82 is enabled and switch 86 is disabled, for normal operation of the tuning circuit 80. Since $f_{vco}(k)$ should be very close to $f_{wanted}$, the settling time for the tuning circuit 80 to reach $f_{wanted}$ will be relatively short.

The VCO frequency $f_{vco}$ can be determined by counting the clocks from the VCO 56 over a $f_{ref}$ clock and comparing the number to a number associated with $f_{wanted}$ in logic 84. The counting function could be performed by an additional counter; however, in the preferred embodiment, the counters in the divider 54 are used to count the $f_{vco}$ clock pulses. As shown in FIG. 10, the current state of the prescaler 68 and counter B 72 are received by logic 84. After the initial control word k is determined, the logic 84 resets prescaler 68, counter A 70 and counter B 72 at the start of a clock period of $f_{ref}$. Unlike normal operation of the divider 54, the modulus of the prescaler 68 remains at P throughout the calibration. At the end of this clock period, the current states of counter B 72 and prescaler 68 are read by logic 84. The counter B bits are concatenated with the prescaler bits to render a count indicative of the frequency $f_{vco}$. This count can be compared to the value BP+A to determine whether $|f_{vco}-f_{wanted}|$ is within the threshold and, if not, whether $f_{vco}$ is greater than $f_{wanted}$.

Because there may be delays between an active edge of $f_{ref}$ and completion of the counter resets, it is possible that there may be minor inaccuracies in the LSBs of the prescaler. Generally, however, these errors will be on the order of hundreds of kilohertz, while the calibration of the VCO 56 only needs to be accurate within a few megahertz.

This embodiment of the invention provides significant advantages. First, it can be used regardless of the size of analog bandwidth (frequency range due to the capacitive range of the varactor) and of the frequency stepping between adjacent calibration words. While this embodiment was illustrated using a small frequency step, it could also be used with the frequency step of FIG. 5 to result in a smaller settling time in some instances. Second, the final precision of the improved algorithm is fixed by the threshold and can be smaller than ±0.5 LSB of the calibration word. Third, a single analog control voltage (i.e., $\upsilon_{cal}$) is used during the entire calibration process, including the additional comparing steps. The precharge of the loop filter 55 to the same value used for the calibration algorithm greatly reduces the PLL settling time, because the analog control voltage will not very significantly after the end of the calibration phase. Fourth, the reduced variation of the analog control voltage prevents large variations of the VCO 56 (and of the PLL loop gain), significantly reducing the loop bandwidth variation and the settling time.

Descriptions of the various embodiments of the invention have assumed that the frequency of the VCO 56 varies directly with the control voltage (i.e., an increase in $\upsilon$ results in and increase in $f_{vco}$) and inversely with the control word (i.e., an increase in the control word results in a decrease in $f_{vco}$). Variations in the described method of calibrating the tuning circuit could result from changes in either of these factors.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the claims.

What is claimed is:

1. A tuning circuit comprising:
   a voltage controlled oscillator for generating a first clock signal comprising:
      an inductive element;
      a variable capacitive element coupled to the inductive element;
      a bank of switched capacitors coupled to the inductive element and the variable capacitive element;
   a frequency divider for generating a second clock signal responsive to the first clock signal and a selected divisor;
   frequency control circuitry for adjusting a control voltage to the variable capacitive element responsive to a frequency difference between the second clock signal and a reference signal to oscillate the first clock signal at a desired frequency; and
   logic circuitry for calibrating the voltage controlled oscillator to a frequency range inclusive of a new desired frequency responsive to a change in the divisor by:
      performing a coarse search by operating the voltage controlled oscillator at a single predetermined control voltage for various capacitive settings of the bank to determine an initial control word for configuring the bank; and
      testing the initial control word to determine whether the initial control word should be used to generate the first clock signal at the new desired frequency or whether the initial control word should be changed to an adjacent control word to generate the first clock signal at the new desired frequency.

2. The tuning circuit of claim 1 wherein said logic circuitry determines an initial control word to configure the bank by using a search having an accuracy that is greater than or equal to ±1 least significant bit of the initial control word.

3. The tuning circuit of claim 1 wherein the logic circuitry tests the initial control word by comparing the desired frequency to upper and lower bounds of a frequency range for the voltage controlled oscillator while configured according to the initial control word.

4. The tuning circuit of claim 3 wherein the logic circuitry determines the initial control word using fast comparisons between an actual frequency at the predetermined control voltage and the desired frequency and determines whether the initial control word should remain the same by using more precise comparisons between the actual frequency and the desired frequency.

5. The tuning circuit of claim 1 wherein the logic circuitry tests the initial control word by determining whether the difference between the desired frequency and an actual frequency for the voltage controlled oscillator while configured according to the initial control word is within a predetermined threshold.

6. The tuning circuit of claim 5 wherein an indication of the actual frequency is determined by counting clock cycles from the voltage controlled oscillator in a frequency divider circuit.

7. A method of calibrating a voltage controlled oscillator for generating a first clock signal, the voltage control oscillator having an LC tank with an inductive element, a variable capacitive element coupled to the inductive element, where the capacitance of the variable capacitive element is controlled by a control voltage, and a bank of switched capacitors coupled to the inductive element and the variable capacitive element, comprising the steps of:

determining an initial control word to configure the bank using a search in which the voltage controlled oscillator is operated at a single predetermined control voltage for various capacitive settings of the bank; a desired frequency; and testing the initial control word to determine whether the frequency range produced by the initial control word should be used to generate the first clock signal at the new desired frequency or whether the initial control word should be changed to an adjacent control word to generate the first clock signal at the new desired frequency.

8. The method of claim 7 wherein said step of determining an initial control word comprises the step of determining an initial control word to configure the bank by using a search having an accuracy that is greater than or equal to ±1 least significant bit of the initial control word.

9. The method of claim 7 wherein the step of testing the initial control word comprises the step of comparing the desired frequency to upper and lower bounds of a frequency range for the voltage controlled oscillator while configured according to the initial control word.

10. The method of claim 9 wherein the step of determining the initial control word comprises the step of using fast comparisons between an actual frequency at the predetermined control voltage and the desired frequency and wherein the step of determining whether the initial control word should remain the same comprises the step of using more precise comparisons between the actual frequency and the desired frequency.

11. The method of claim 7 wherein the step of testing the initial control word comprises the step of determining whether the difference between the desired frequency and an actual frequency for the voltage controlled oscillator while configured according to the initial control word is within a predetermined threshold.

12. The method of claim 7 wherein the step of determining whether the difference between the desired frequency and an actual frequency is within a predetermined threshold comprises the step of calculating an indication of the actual frequency by counting clock cycles from the voltage controlled oscillator in a frequency divider circuit.

* * * * *